United States Patent [19]
Lee et al.

[11] Patent Number: 5,821,590
[45] Date of Patent: Oct. 13, 1998

[54] SEMICONDUCTOR INTERCONNECTION DEVICE WITH BOTH N- AND P-DOPED REGIONS

[75] Inventors: Soo-cheol Lee; Heon-jong Shin, both of Seoul, Rep. of Korea

[73] Assignee: Samsung Electronics Co., Ltd., Suwon, Rep. of Korea

[21] Appl. No.: 953,645

[22] Filed: Oct. 17, 1997

Related U.S. Application Data

[63] Continuation of Ser. No. 578,913, Dec. 27, 1995, abandoned.

[30]        Foreign Application Priority Data

Jul. 24, 1995 [KR] Rep. of Korea ........................ 95-21945

[51] Int. Cl.$^6$ .................................................. H01L 29/76
[52] U.S. Cl. ............................................ 257/377; 257/755
[58] Field of Search ..................................... 257/755, 377, 257/754, 750, 741, 757, 769

[56]                  References Cited

U.S. PATENT DOCUMENTS

| 5,223,456 | 6/1993 | Malwah ................................. | 437/200 |
| 5,237,196 | 8/1993 | Mikata et al. .......................... | 257/409 |
| 5,355,010 | 10/1994 | Fujii et al. ............................... | 257/377 |

OTHER PUBLICATIONS

"Dual (n+/p+) Polycide Interconnect Technology Using Poly–Si/WSi2/poly–Si Structure And Post B+ Implantation," by Toyokazu Fujii, Shin Hashimoto, Yasushi Naito and Yuichi Hirofuji.; IEDM 92–845; Apr. 1992.

*Primary Examiner*—Jerome Jackson
*Assistant Examiner*—Nathan K. Kelley
*Attorney, Agent, or Firm*—Jones & Volentine, L.L.P.

[57]                  ABSTRACT

A semiconductor device which can interconnect different types of impurity region without increasing a contact resistance including a first impurity diffusion region formed on a first portion of a semiconductor substrate, a second impurity diffusion region formed on a second portion of the semiconductor substrate, an interlevel insulating layer having a contact hole exposing the first and second impurity regions on the semiconductor substrate, a first conductive layer formed on the interlevel insulating layer, a second conductive layer formed on the overall surface of the substrate, wherein the second conductive layer formed on the first impurity diffusion region is doped with the same impurities as doped into the first impurity diffusion region and the second conductive layer formed on the second impurity diffusion region is doped with the same impurities as doped into the second impurity diffusion region, and a manufacturing method thereof are disclosed. For electrical interconnection of different types of diffusion regions with a polyside layer, the polysilicon layer is formed on only the innerside wall of the contact hole exposing the n$^+$ and the p$^+$ diffusion regions and on the surface of the n$^+$ and p$^+$ diffusion regions, and the polyside layer is formed on the other regions, to thereby prevent the increase of the contact resistance.

8 Claims, 4 Drawing Sheets

SEMICONDUCTOR INTERCONNECTION DEVICE WITH BOTH N- AND P-DOPED REGIONS

This is a continuation of application Ser. No. 08/578,913, filed on Dec. 27, 1995, which was abandoned upon the filing hereof.

BACKGROUND OF THE INVENTION

The present invention relates to a semiconductor device and manufacturing method. More particularly, the present invention relates to an interconnection in a semiconductor device which can interconnect different types of impurity regions without increasing contact resistance, and a manufacturing method for this interconnection.

In a semiconductor device that includes a CMOS inverter circuit, the impurity regions of a pMOS transistor and an nMOS transistor can be electrically connected to each other. For electrical interconnection of the different types of impurity diffusion regions, e.g., a p-type impurity diffusion region ($p^+$ diffusion region) and an n-type impurity diffusion region ($n^+$ diffusion region), a metal layer, e.g., made of aluminum (Al), can be used. When using a metal layer, however, the impurity diffusion layer should be formed at a predetermined margin from the metal layer to block a leakage current. However, using a metal layer has the undesirable effect of increasing the size of such devices and precluding the use of high-temperature processes such as planarization using a BPSG layer.

To overcome the aforementioned problems, there was proposed a method that the $p^+$ diffusion region and the $n^+$ diffusion region are interconnected with a polyside layer in U.S. Pat. No. 4,710,897. FIG. 1 is a cross-sectional view of the interconnection of a semiconductor device in which the $p^+$ diffusion region and the $n^+$ diffusion region are interconnected with the polyside layer according to prior art.

More specifically, FIG. 1 shows an N-well 2 and a P-well 3 formed on a semiconductor substrate 1. A field oxide layer 4 is formed on a part of the surface of semiconductor substrate 1, thereby defining an active region. Furthermore, $p^+$ and $n^+$ diffusion regions 5 and 6 are formed on the active region. An interlevel insulating layer 7, which has contact holes for exposing the $p^+$ and $n^+$ diffusion regions, is also formed on the active region. An $n^+$ polysilicon layer 9a and a $p^+$ polysilicon layer 9b are formed on interlevel insulating layer 7, on the innerside wall of the contact hole, and on the $p^+$ and $n^+$ diffusion regions, respectively. A tungsten silicide layer 11 is formed on $n^+$ and $p^+$ polysilicon layers 9a and 9b. Accordingly, the interconnection shown in FIG. 1 has a structure that $p^+$ and $n^+$ diffusion regions 5 and 6 are interconnected with a polyside layer including polysilicon layers 9a and 9b and tungsten silicide layer 11. Also, an insulating layer 15 is formed on the overall surface of semiconductor substrate 1.

In the interconnection shown in FIG. 1, although lateral diffusion between the polysilicon layers is so small that it can be ignored, boron and arsenic are diffused through the tungsten silicide layer because of its large diffusivity. Also, segregation of boron occurs at the interface of an oxide layer formed in the succeeding process and the tungsten silicide layer. The diffusion of boron and arsenic and the segregation of boron both lead to an increase of a $p^+$ contact resistance, which becomes more serious because of the larger diffusivity of boron compared to arsenic. Therefore, when the polyside layer is used, there are many difficulties in interconnecting the $n^+$ contact hole due to the increase of the $p^+$ contact resistance.

To overcome the problem of the interconnection shown in FIG. 1, a method for forming the $p^+$ polysilicon layer on the tungsten silicide layer was proposed in T. Fujii et al., "Dual ($n^+/p^+$) Polycide interconnect technology using poly-Si/WSi2-Si structure and Post $B^+$ Implantation," pp845–848, IEDM, (1992). FIG. 2 is a cross-sectional view of an interconnection of a semiconductor device in which the $n^+$ and $p^+$ diffusion regions are interconnected with a double layer including the polyside layer and the $p^+$ polysilicon layer according to this proposal. In FIG. 2, the same reference numerals denote the same members as in FIG. 1.

The device of FIG. 2 differs from that of FIG. 1 in that it further includes a $p^+$ polysilicon layer 13 formed on the tungsten silicide layer 11 of FIG. 1. The $p^+$ polysilicon layer 13 restrains the diffusion of boron and the segregation of boron at the interface of the oxide layer and the tungsten silicide layer. In the interconnection shown in FIG. 2, the $p^+$ contact resistance is reduced to about 50%, while the contact resistance of the $n^+$ diffusion region is increased when the $n^+$ and $p^+$ diffusion regions becomes close. Although this does reduce the problem of increased contact resistance in the $p^+$ layer, it does not eliminate it or reduce it sufficiently.

SUMMARY OF THE INVENTION

An object of the present invention is to provide a semiconductor device which can interconnect a $p^+$ diffusion region and an $n^+$ diffusion region without increasing contact resistance.

Another object of the present invention, is to provide a manufacturing method of a semiconductor device which can interconnect a $p^+$ diffusion region and an $n^+$ diffusion region without increasing the contact resistance.

To achieve the first object, a semiconductor device of the present invention comprises: a first impurity diffusion region formed on a first portion of a semiconductor substrate; a second impurity diffusion region formed on a second portion of the semiconductor substrate; an interlevel insulating layer having a contact hole for exposing the first and second impurity diffusion regions formed on the semiconductor substrate; a first conductive layer formed on the interlevel insulating layer; and a second conductive layer formed on the overall surface of the substrate wherein the second conductive layer formed on the first impurity diffusion region is doped with the same impurities as doped into the first impurity diffusion region and the second conductive layer formed on the second impurity diffusion region is doped with the same impurities as doped into the second impurity diffusion region.

The first impurity diffusion region preferably comprises a p-type impurity and the second impurity diffusion region preferably comprises an n-type impurity. The first conductive layer preferably comprises polysilicon or a composite including a polysilicon layer and silicide. The silicide layer preferably comprises tungsten silicide or titanium silicide. The second conductive layer preferably comprises polysilicon. Although the first and second conductive layers preferably comprise polysilicon, they may also be made of amorphous silicon.

To achieve the second object, a manufacturing method of the semiconductor device according to the present invention comprises the steps of: implanting impurities into a semiconductor substrate to form p-type and n-type impurity diffusion regions; forming an interlevel insulating layer having a contact hole for exposing the p-type and n-type impurity diffusion regions; forming a first conductive layer on the interlevel insulating layer; and forming a second conductive layer on the overall surface of the substrate where the first conductive layer is formed, wherein the second conductive layer formed on the p-type impurity diffusion region is doped with p-type impurities and the second conductive layer formed on the n-type impurity diffusion region is doped with n-type impurities.

The first conductive layer preferably comprises polysilicon or a composite including polysilicon and silicide. The silicide layer preferably comprises tungsten silicide or titanium silicide. The second conductive layer preferably comprises polysilicon. Although the first and second conductive layers preferably comprise polysilicon, they may also be made of amorphous silicon.

According to the present invention, in the electrical interconnection of the different types of diffusion regions with the polyside layer, only the innerside wall of the contact hole exposing the $n^+$ and $p^+$ diffusion regions and the surfaces of the $n^+$ and $p^+$ diffusion regions are formed of polysilicon and the other interconnection regions are formed of polyside, which leads to prevent the increase of the contact resistance.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF PREFERRED EMBODIMENTS OF THE INVENTION

Figure 3:
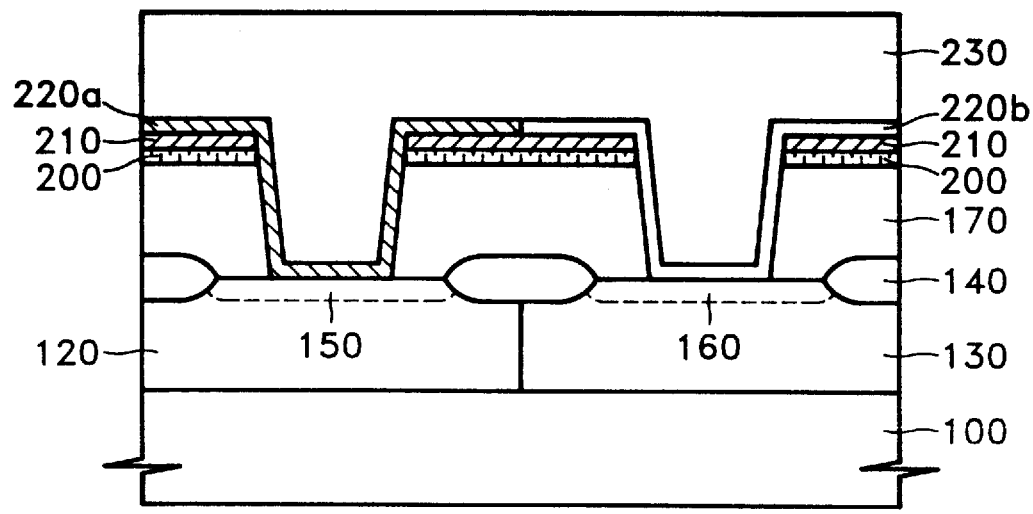
FIG. 3 is a cross-sectional view illustrating an interconnection of a semiconductor device having different types of impurity diffusion regions according to a first embodiment of the present invention.

FIG. 3 is a cross-sectional view illustrating an interconnection of a semiconductor device having $n^+$ and $p^+$ impurity diffusion regions according to a first embodiment of the present invention. More specifically, an N-well 120 and a P-well 130 are formed on a semiconductor substrate 100 and a field oxide layer 140 is formed on a part of the N-well 120 and the P-well 130, to define an active region. Furthermore, a $p^+$ diffusion region 150 and an $n^+$ diffusion region 160 are formed on the active region and an interlevel insulating region 170, having a contact hole exposing $p^+$ and $n^+$ diffusion regions 150 and 160, is formed over the N-well 120, the P-well 130, and the field oxide layer 140.

A polysilicon layer 200 and a silicide layer 210, are formed on the interlevel insulating layer 170 as first conductive layers. A $p^+$ polysilicon layer 220a and an $n^+$ polysilicon layer 220b are formed over and on the innerside walls of first conductive layers 200 and 210 and over the contact hole and the $p^+$ and $n^+$ diffusion regions to form second conductive layers. An insulating layer 230 is formed over polysilicon layers 220a and 220b.

Figure 1:
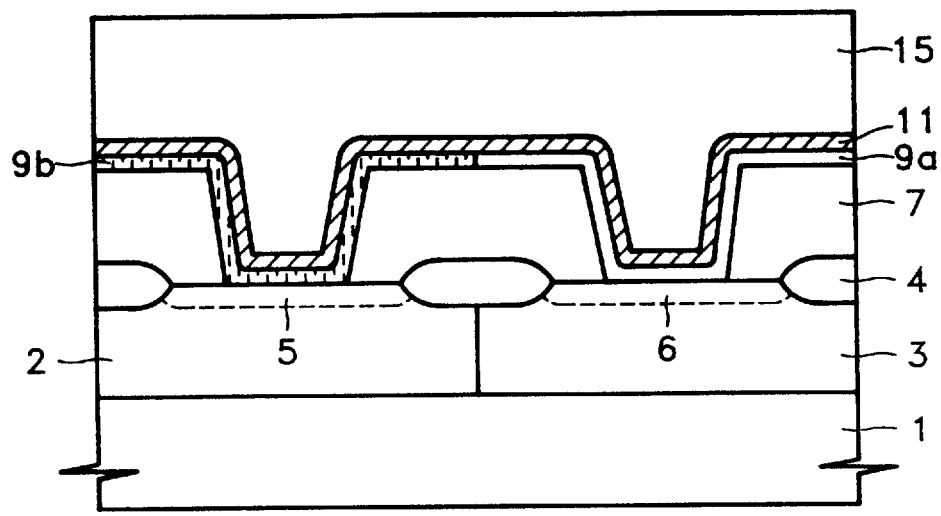
FIG. 1 is a cross-sectional view illustrating one interconnection of a semiconductor device having different types of impurity diffusion regions according to the prior art.
Figure 2:
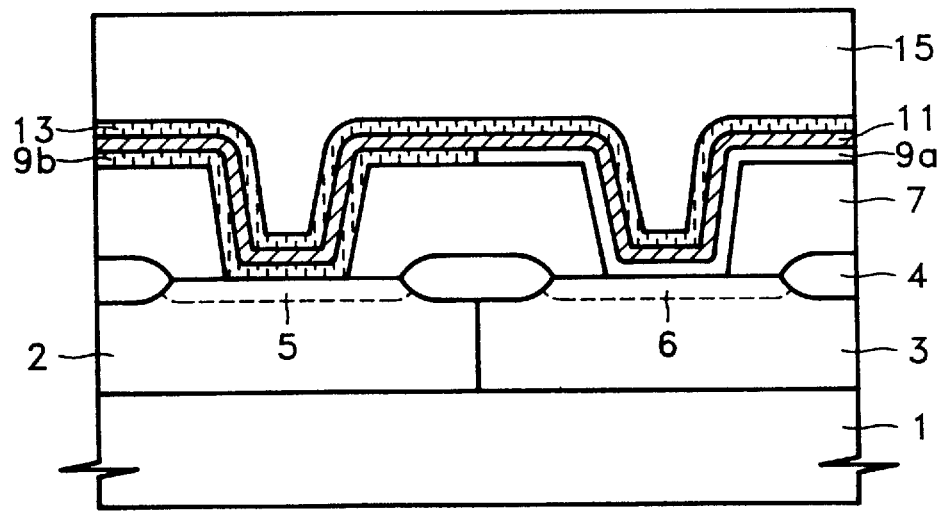
FIG. 2 is a cross-sectional view illustrating another interconnection of a semiconductor device having different types of impurity diffusion regions according to the prior art.

Unlike the device shown in prior art FIGS. 1 and 2, a silicide layer is not formed on the $p^+$ polysilicon layer 220a and the $n^+$ polysilicon layer 220b. Accordingly, the interconnection of the present invention, in which the polysilicon layer and the silicide layer are used as an interconnecting layer, can be applied to a succeeding high-temperature process. Since the silicide layer is not formed on the contact hole, it cannot inhibit the contact resistance caused by the lateral diffusion. Furthermore, $p^+$ and $n^+$ polysilicon layers 220a and 220b (acting as second conductive layers) are doped with the same impurities as in the impurity regions where respective second conductive layers are formed, to thereby prevent the increase of the contact resistance.

Figure 4:
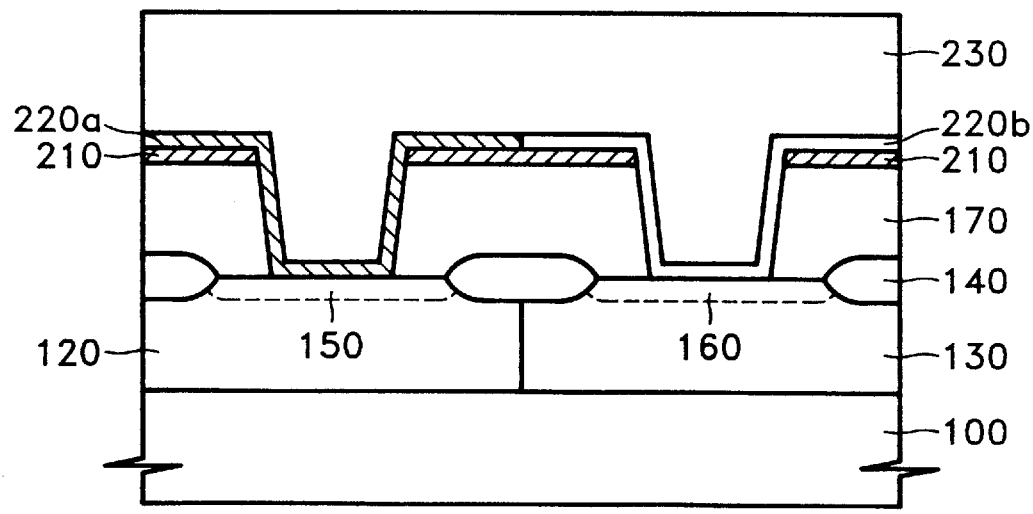
FIG. 4 is a cross-sectional view illustrating an interconnection of a semiconductor device having different types of impurity diffusion regions according to a second embodiment of the present invention.

FIG. 4 is a cross-sectional view illustrating an interconnection structure having $n^+$ and $p^+$ impurity diffusion regions according to a second embodiment of the present invention. In the second embodiment, the same reference numerals as in the first embodiment denote the same members as in the first embodiment. More specifically, the interconnection shown in FIG. 4 is the same one as in FIG. 3, except that the polysilicon layer 200 in FIG. 3 is not formed. Although the polysilicon payer 200 provides some benefits, the problem of the prior art can be solved without forming polysilicon layer 200 shown in the first embodiment.

Figure 5:
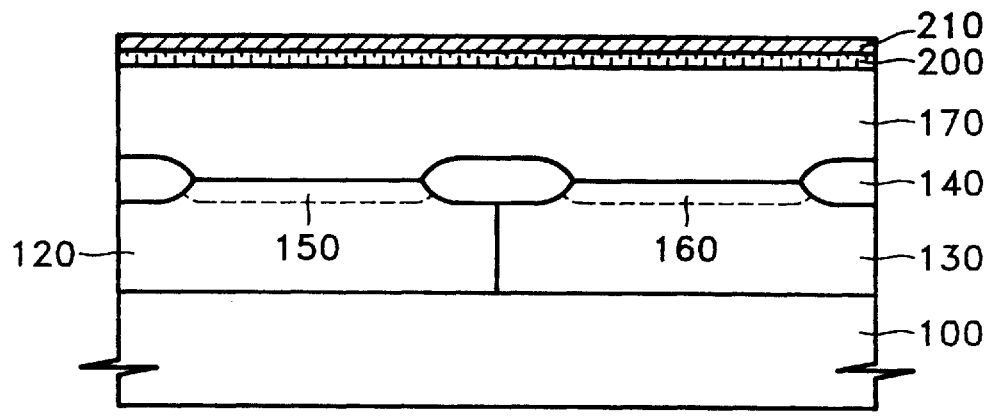
FIGS. 5–8 are cross-sectional views showing a method for manufacturing the interconnection of the semiconductor device shown in FIG. 3.

FIGS. 5–8 are cross-sectional views showing the method for manufacturing the interconnection of the semiconductor device in FIG. 3. FIG. 5 shows steps of forming a $p^+$ diffusion region 220a, an $n^+$ diffusion region 220b, an interlevel insulating layer 170, a first polysilicon layer 200, and a silicide layer 210 over an N-well 120 and a P-well 130 formed on a semiconductor substrate 100. More specifically, the N-well 120 and the P-well 130 are formed on the semiconductor substrate 100 and the field oxide layer 140 is formed thereon by using a device isolation method. The $p^+$ diffusion region 150 is then formed on the portion where a source or drain region of the p-channel transistor is to be formed, and the $n^+$ diffusion region 160 is formed on the portion where a source or drain region of the n-channel transistor is to be formed. Next, the interlevel insulating layer 170, the first polysilicon layer 220, and the silicide layer 210 are sequentially formed on the overall surface of the substrate. The silicide layer is preferably formed of a tungsten silicide layer or a titanium silicide layer, but can be made out of any silicide having desirable properties. The first polysilicon layer 200 can be formed of an impurity-doped conductive layer or an impurity-undoped conductive layer.

Figure 6:
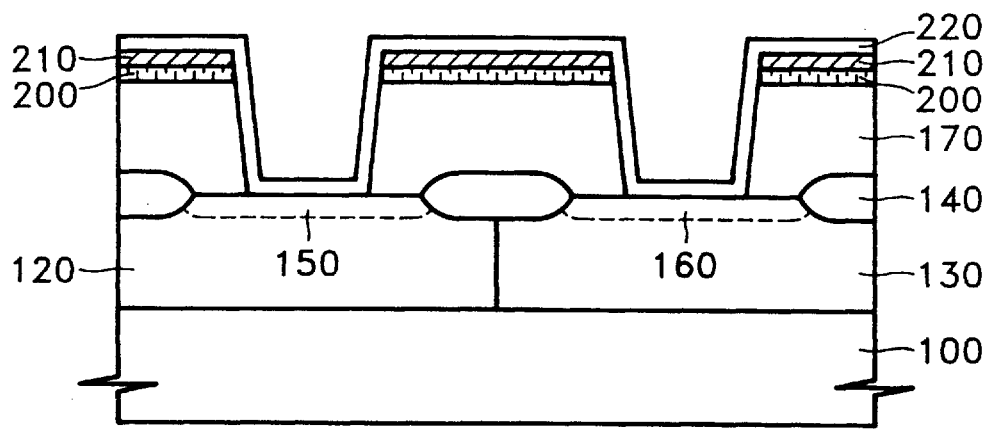

FIG. 6 shows steps of forming a contact hole exposing the $p^+$ and the $n^+$ diffusion regions and forming the second polysilicon layer 220. More specifically, FIG. 6 shows that after forming a photoresist pattern (not shown) on the silicide layer 210, the first polysilicon layer 200 and the interlevel insulating layer 170 are etched using the photoresist pattern as a etching mask to form the contact hole for exposing $p^+$ and $n^+$ diffusion regions 150 and 160. In this way, the first conductive layer including the first polysilicon layer 200 and the silicide layer 210 is formed. The second polysilicon layer 220, used as a second conductive layer, is formed on the overall surface of the substrate where the contact hole is formed.

Figure 7:
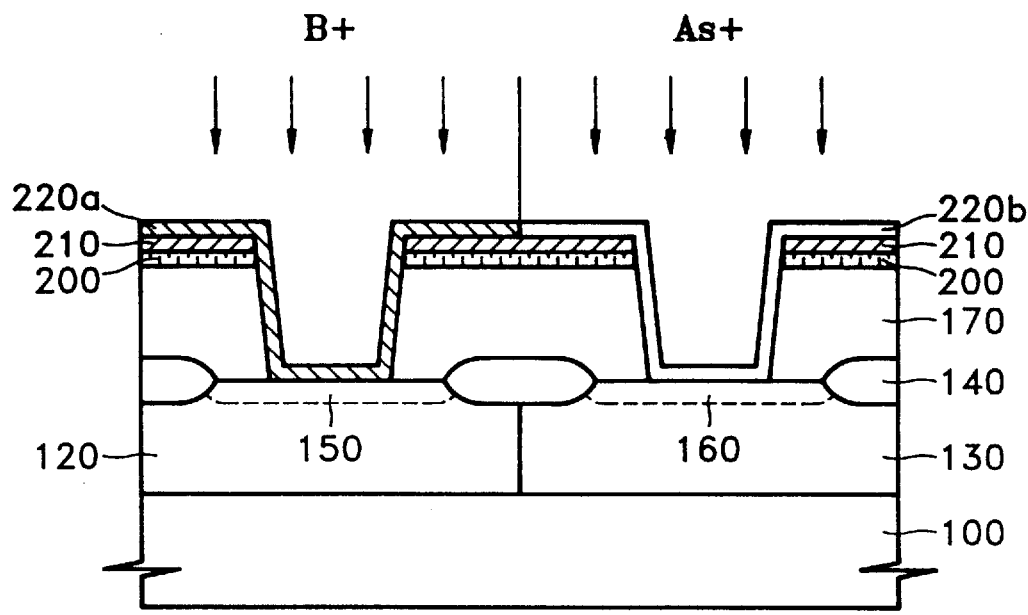

FIG. 7 shows steps of implanting impurities into second polysilicon layer 220. More specifically, boron ions are implanted, preferably by a photo process, into the polysilicon layer on the p-channel transistor region at the implantation dose of not less than $10^{15}/cm^2$, thus forming the $p^+$ polysilicon layer 220a. In addition, arsenic ions are implanted, also preferably by a photo process, into the polysilicon layer on the n-channel transistor region at the implantation dose of not less than $10^{15}/cm^2$, thereby forming the n⁺ polysilicon layer 220b. In this way, the p⁺ polysilicon layer 220a and the n⁺ polysilicon layer 220b are formed.

Figure 8:
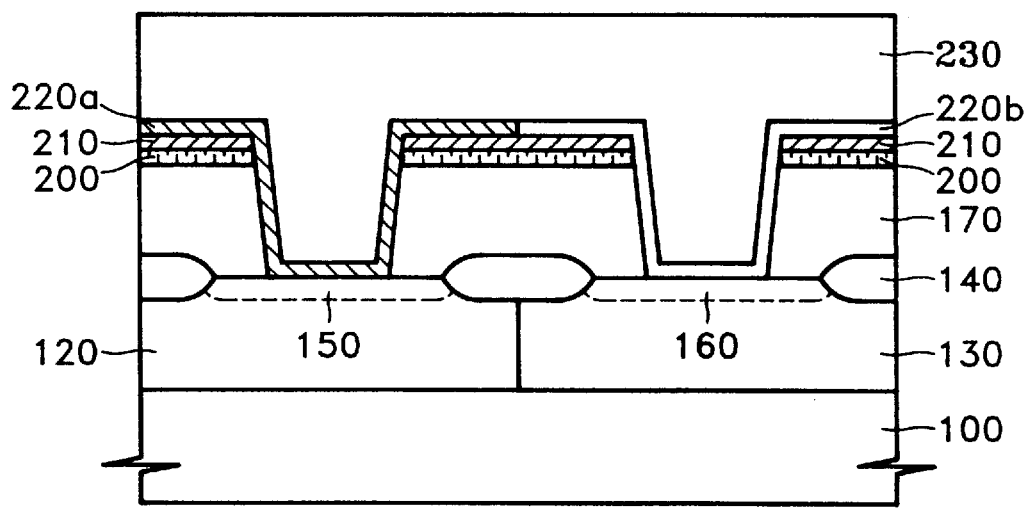

FIG. 8 shows steps of forming a silicon oxide layer 230. More specifically, an insulating layer 230, preferably silicon oxide, is formed on the overall surface of the substrate where p⁺ and n⁺ polysilicon layers 220a and 220b are formed.

According to the present invention, for electrical interconnection of different types of diffusion region with a polyside layer, the polysilicon layer is formed on only the innerside wall of the contact hole exposing the n⁺ and p⁺ diffusion regions and on the surface of the n⁺ and p⁺ diffusion regions, and the polyside layer is formed on the other regions, to thereby prevent the increase of the contact resistance.

The present invention is not limited to the above-described embodiments. Various changes and modifications may be effected by one having an ordinary skill in the art and remain within the scope of the invention, as defined by the appended claims.

What is claimed is:

1. A semiconductor device comprising:

a first impurity diffusion region formed on a first portion of a semiconductor substrate;

a second impurity diffusion region formed on a second portion of said semiconductor substrate;

an interlevel insulating layer having a plurality of contact holes exposing the first and second impurity diffusion regions;

a first conductive layer formed on the surface of the interlevel insulating layer; and a second conductive layer formed over the first conductive layer and in the plurality of contact holes to contact the first and second impurity diffusion regions on the surface of the substrate, wherein a first portion of the second conductive layer formed over and contacting the first impurity diffusion region is doped with the same impurities as are doped into the first impurity diffusion region and a second portion of the second conductive layer formed over and contacting the second impurity diffusion region is doped with the same impurities as are doped into the second impurity diffusion region, and wherein the first and second portions of the second conductive layer are formed next to each other.

2. A semiconductor device as claimed in claim 1, wherein the first impurity diffusion region is formed by a p-type impurity.

3. A semiconductor device as claimed in claim 1, wherein the second impurity diffusion region is formed by an n-type impurity.

4. A semiconductor device as claimed in claim 1, wherein the first conductive layer comprises a polysilicon layer.

5. A semiconductor device as claimed in claim 1, wherein the first conductive layer comprises a composite layer of a polysilicon layer and a silicide layer.

6. A semiconductor device as claimed in claim 5, wherein the silicide layer comprises a material selected from the group consisting of a tungsten silicide and titanium silicide.

7. A semiconductor device as claimed in claim 1, wherein the second conductive layer comprises a polysilicon layer.

8. A semiconductor device as claimed in claim 1, wherein said first and second conductive layers are made of an amorphous silicon layer.

* * * * *